(12) United States Patent
Inamdar et al.

(10) Patent No.: US 7,468,630 B2
(45) Date of Patent: Dec. 23, 2008

(54) SUPERCONDUCTING SWITCHING AMPLIFIER

(75) Inventors: Amol A. Inamdar, Elmsford, NY (US); Sergey V. Rylov, White Plains, NY (US)

(73) Assignee: Hypres, Inc., Elmsford, NY (US)

( * ) Notice: Subject to any disclaimer, the term of this patent is extended or adjusted under 35 U.S.C. 154(b) by 129 days.

(21) Appl. No.: 11/705,351

(22) Filed: Feb. 12, 2007

(65) Prior Publication Data
US 2008/0048762 A1   Feb. 28, 2008

Related U.S. Application Data

(60) Provisional application No. 60/840,379, filed on Aug. 25, 2006.

(51) Int. Cl.
   *H03F 19/00*   (2006.01)
   *H03K 3/38*   (2006.01)

(52) U.S. Cl. .................................. 330/207 A; 327/527

(58) Field of Classification Search ........................ None
See application file for complete search history.

(56) References Cited

U.S. PATENT DOCUMENTS

| | | | | |
|---|---|---|---|---|
| 3,943,383 A * | 3/1976 | Hamel | ......................... | 327/171 |
| 4,496,854 A * | 1/1985 | Chi et al. | ........................ | 326/5 |
| 4,902,908 A * | 2/1990 | Harada | ......................... | 327/367 |
| 4,947,118 A * | 8/1990 | Fujimaki | ...................... | 324/248 |
| 5,019,721 A * | 5/1991 | Martens et al. | ............... | 327/527 |
| 5,051,627 A * | 9/1991 | Schneier et al. | ................. | 326/4 |
| 5,295,093 A * | 3/1994 | Nagasawa | ..................... | 365/162 |
| 5,479,131 A * | 12/1995 | Lee | ............................. | 327/367 |
| 5,612,615 A * | 3/1997 | Gold et al. | .................... | 323/360 |
| 5,818,373 A * | 10/1998 | Semenov et al. | ............. | 341/133 |
| 5,936,458 A * | 8/1999 | Rylov | .......................... | 327/528 |
| 6,242,939 B1 * | 6/2001 | Nagasawa et al. | ............... | 326/3 |
| 6,294,954 B1 * | 9/2001 | Melanson | ..................... | 330/10 |
| 6,365,912 B1 * | 4/2002 | Booth et al. | ................... | 257/39 |

(Continued)

OTHER PUBLICATIONS

Hibbs et al.; New Amplifier Configuration based on the Circulating Current State of a DC SQUID; Physica C 368 (2002) 146-152.*

*Primary Examiner*—Robert Pascal
*Assistant Examiner*—Krista M Flanagan
(74) *Attorney, Agent, or Firm*—Henry I. Schanzer

(57) ABSTRACT

A superconducting switching amplifier embodying the invention includes superconductive devices responsive to input/control signals for clamping the output of the amplifier to a first voltage or to a second voltage. The amplifier includes a first set of superconducting devices serially connected between a first voltage line and an output terminal and a second set of superconducting devices serially connected between the output terminal and a second voltage line. The first set and the second set of devices are operated in a complementary fashion in response to control signals. When one of the first and second sets is driven to a superconducting (zero resistance) state the other set is driven to a resistive state. In accordance with the invention, the devices of each set are laid out in a pattern and driven in a manner to enable all the devices of each set to be driven to a selected state at substantially the same time. In one embodiment, the devices in each set are superconducting quantum interference devices (SQUIDs). Four sets of superconductive devices may be interconnected to function as a differential switching amplifier. The operating voltage applied to an amplifier may be varied to provide additional shaping of the output signal.

28 Claims, 13 Drawing Sheets

U.S. PATENT DOCUMENTS

| | | | |
|---|---|---|---|
| 6,819,177 B2 * | 11/2004 | Ruha et al. | 330/207 A |
| 7,095,227 B2 * | 8/2006 | Tarutani et al. | 324/248 |
| 7,129,869 B2 * | 10/2006 | Furuta et al. | 341/133 |
| 7,365,663 B2 * | 4/2008 | Rylov et al. | 341/133 |
| 2004/0173793 A1 * | 9/2004 | Blais et al. | 257/31 |
| 2007/0279058 A1 * | 12/2007 | Bulkes et al. | 324/314 |

* cited by examiner

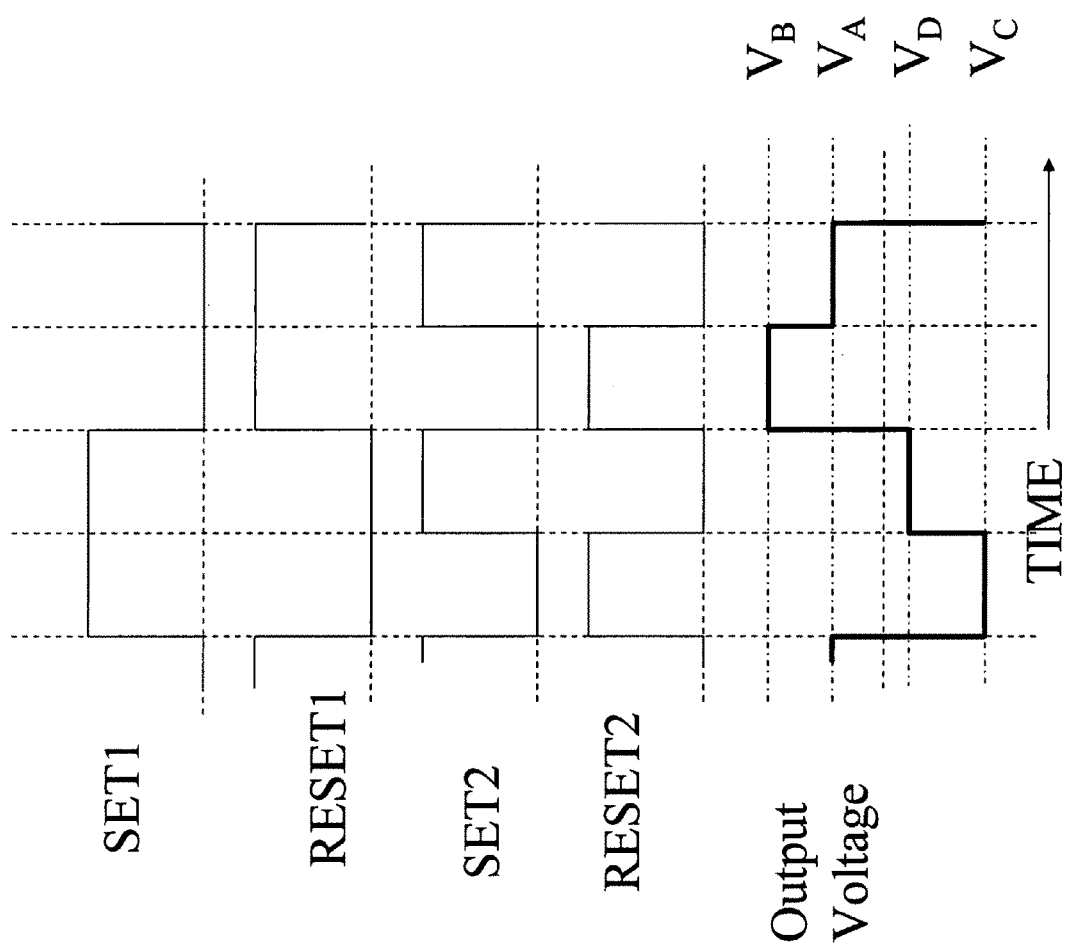

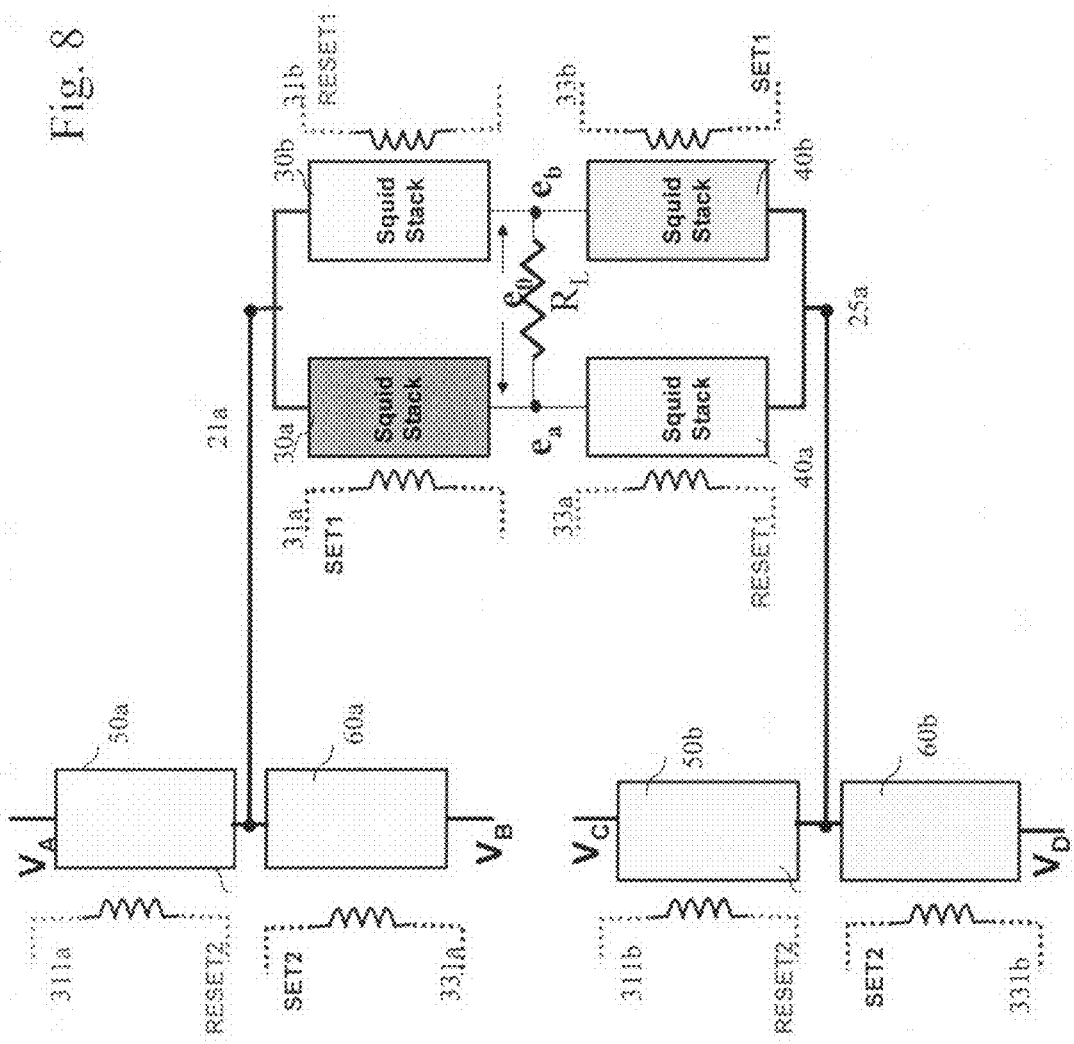

SUPERCONDUCTING SWITCHING AMPLIFIER

This invention claims priority based on Provisional Application Ser. No. 60/840,379 filed Aug. 25, 2006 and titled "Techniques for Processing Multi-GHz Frequency Signals".

This invention was developed in part under Army SBIR Contract W15P7T-04-C-K-403.

BACKGROUND OF THE INVENTION

This invention relates to superconducting circuits employing devices such as those known as Josephson junctions (JJs).

It is known in the art to employ JJs integrated together according to a rapid-single flux-quantum (RFSQ) methodology to manufacture ultrafast superconducting digital circuits.

The RSFQ technology is a low-voltage technology producing pulses having amplitudes in the range of 0.5 millivolts (mV) which are very fast (e.g., 4 picoseconds wide). In order to transmit the digital information generated by and within these RSFQ circuits for processing by standard semiconductor circuits, several stages of amplification are needed to increase the amplitude of the pulses while maintaining high speed of operation without introducing noise and distortion.

A prior art superconducting circuit for amplifying signals is shown in FIG. 1. FIG. 1 is a highly simplified schematic diagram which shows a current source, 10, supplying a current (Ics), to a stack 12 of superconducting quantum interference devices (SQUIDs) connected in series between an output terminal 17 and a point of reference potential 19, shown as ground. A load resistor RL is connected in parallel with the stack 12. FIG. 2 shows the stack 12 includes "n", generally identical, SQUIDs (12a through 12n) connected in series with the same SQUID current (Ics) flowing through each SQUID of the stack 12. Each SQUID (see for example 12i) includes an input node, 121, and an output node 123 and two JJs (JJ1, JJ2) interconnected (in parallel) by inductive elements defining an inductive loop. SQUIDs have a settable critical current (Ic) and are characterized (as shown in FIG. 3) such that: (a) when the SQUID current (Ics) flowing between the input and output nodes of a SQUID is below the critical current (Ic) of the Josephson Junctions of the SQUID, the SQUID is in its superconducting state, exhibiting essentially zero resistance between its input and output nodes; and (b) when the current, Ics, flowing between the input and output nodes of a SQUID is above the critical current (Ic) of the SQUID, the SQUID is placed in its resistive state, exhibiting a finite resistance (e.g., 1 ohm) between its input and output nodes. A control current (Icc or Is) may be electromagnetically coupled to a SQUID, as shown in FIGS. 1 and 2, such that the SQUID's critical current (Ic) is raised to a higher value (Ic=Ich) or is decreased (i.e., depressed) to a lower value (Ic=Icd). Thus, for a given Ics flowing through a SQUID, it can be driven between a superconducting state and a resistive state by varying the Icc electromagnetically coupled to the SQUID.

FIGS. 1 and 2 show a critical current control circuit (a signal generator) 14 whose current output, designated as Is or Icc, is distributed via a line 15 to the SQUIDs of the stack for electromagnetically controlling/setting the value of the critical current (Ic) in the SQUIDs of the stack.

For purpose of illustration it may be assumed that the resistance of a single SQUID, in its resistive state, is in the range of one (1) ohm. In order to amplify the signal and generate signal voltages of several millivolts it is necessary to have many SQUIDs stacked in series. Assume, for purpose of example, that 50 SQUIDs are stacked in series and, when in the resistive state, the SQUID stack has a total resistance of Rs and that an RL of 50 ohms is connected in parallel with the stack.

When the stack 12 is in its superconductive state, the output line 17 is clamped to ground. When the stack 12 is in the resistive state, the voltage on output line 17 is equal to [Ics]×[(Rs)(RL)/(Rs)+(RL)]. This enables the production of a unipolar amplified signal. However, the prior art circuit suffers from some significant limitations in that the output for the resistive state condition is not well defined. That is, the output signal condition is a function of the value of, and limitations, on Ics and of the Rcs of the stack. For a given Ics, within the range of Icd and Ich, flowing through a SQUID, the SQUID can be driven between a resistive state and a superconductive state. However, if Ics is made greater than some value of Ich, the SQUID can not be readily switched from the resistive state to superconductive state. Thus, the prior art circuit provides for a degree of signal amplification, but does not ensure that the output signal is driven to a known and fixed voltage level when the SQUIDs in the stack are in the resistive state.

When the SQUIDs in a stack are in the superconductive state, they have essentially zero impedance. Therefore, if the SQUIDs in a stack were driven by a voltage source excessive currents would flow through the short circuit (zero impedance) condition. Thus, in accordance with the prior art, as shown in FIGS. 1 and 2, the SQUIDs in a stack are driven by a current source whose current, Ics, flows to ground either via a short circuit or via the parallel combination of the stack resistance in parallel with the load resistance. The stack of SQUIDS cannot be driven by a voltage source because of the short circuit condition which would cause undesirably large currents to flow.

Another problem with the prior art circuit (see FIG. 2) is that it is desirable for all the SQUIDs in the stack to be turned on to one condition, or another, at the same time. However, when there are a large number of SQUIDs, it is difficult to distribute the control signal to achieve this result. For example, in FIG. 2 the control line 15 is shown to be wound around all the SQUIDs of the stack so as to distribute the control signal in a serial fashion to the SQUIDs. At the operating frequencies of interest even small differences in the length of the control signal line between different ones of the SQUIDs results in different propagation delays and the application of set or reset signals at different times to the different SQUIDs. The operation of the stack and the speed of response are then adversely affected.

Accordingly, it is desirable to have an improved amplifier which can provide ultra fast voltage amplification reliably.

SUMMARY OF THE INVENTION

A superconducting switching amplifier embodying the invention includes superconductive means responsive to input signals for clamping the output of the amplifier to a first voltage or to a second voltage. The amplifier includes first and second voltage lines for the respective application thereto of first (V1) and second (V2) different voltages. A first set of superconducting devices is serially connected between the first voltage line and an output terminal. A second set of superconducting devices is serially connected between the output terminal and the second voltage line. The devices comprising the first and second set of devices are of the type which have a critical current (Ic) which may be selectively raised or lowered, and which exhibit: (a) a virtually zero resistance state, also defined as the superconducting state, when the current (Ics) through the devices of the set is below a critical current (Ic); and (b) a resistive state, in which there is finite resistance in the conduction path, when the current (Ics) through the devices of the set is above a critical current (Ic). In accordance with the invention, depending on the input signal one of the two sets of devices is operated in the superconducting state while the other set is operated in the resistive state.

In accordance with one embodiment of the invention, in response to a given input signal, complementary control signals are generated and coupled to the first and second set of devices for raising the critical currents of the devices of one set while decreasing the critical currents of the devices in the other set, whereby for one input signal condition the voltage on the first voltage line is clamped via the low (zero) impedance of one set to the output terminal and for another input signal condition the voltage on the second voltage line is clamped via the low (zero) impedance of the other set to the output terminal.

In one embodiment of the invention the devices in each set are superconducting quantum interference devices (SQUIDs); one set of SQUIDs being connected in series between the first voltage line and the output terminal, and another set of SQUIDs being connected in series between the output terminal and the second voltage line.

In an embodiment of the invention a load resistor is connected between the output terminal and a point of potential having a value between the voltages applied to the first and second lines.

In another embodiment of the invention, a switching means is provided to selectively apply different voltages to the first and second voltage lines from which power is delivered to a switching amplifier embodying the invention for modifying the voltage produced at its output terminal.

In a still further embodiment of the invention: (a) a first set of devices is connected between a first voltage line and a first output terminal, (b) a second set of devices is connected between a first output terminal and a second voltage line; (c) a third set of devices is connected between a third voltage line and a second output terminal; (d) a fourth set of devices is connected between the second output terminal and a fourth voltage line; (e) a load is connected between the first and second output terminals; and (f) control signals are supplied to the first, second, third and fourth sets of devices for either (a) causing the devices of the first and fourth sets to be in their superconductive states and the devices of the second and third sets to be in their resistive states; or (b) causing the devices of the first and fourth sets to be in their resistive states and the devices of the second and third sets to be in their superconductive states. The same voltages (e.g., V1) may be applied to the first and third lines and the same voltages (e.g., V2) may be applied to the second and fourth lines.

In a still further embodiment of the invention, a fifth set of devices is connected between a first potential source and said first voltage line, and a sixth set of devices is connected between the first voltage line and a second potential source and control signals are supplied to the fifth and sixth sets of devices for selectively clamping said first voltage line to said first potential source or to said second potential source.

Still further, a seventh set of devices is connected between a third potential source and said second voltage line, and an eighth set of devices is connected between the second voltage line and a fourth potential source and control signals are supplied to the seventh and eighth sets of devices for selectively clamping said second voltage line to said third potential source or to said fourth potential source.

In accordance with the invention, the devices of each set are laid out in a pattern and driven in a manner for enabling all the devices of each set to be driven to one condition or another at substantially the same time.

BRIEF DESCRIPTION OF THE DRAWINGS

In the accompanying drawings like reference characters denote like components.

FIG. 6A is a waveform diagram pertaining to the circuit of FIG. 6;

FIG. 7A is a waveform diagram of an output pattern produced by the circuit of FIG. 7;

FIG. 8 is a block diagram of a differential amplifier embodying the invention with circuitry for switching the supply voltages applied to the differential amplifier;

DETAILED DESCRIPTION OF THE INVENTION

Figures 4, 4A:
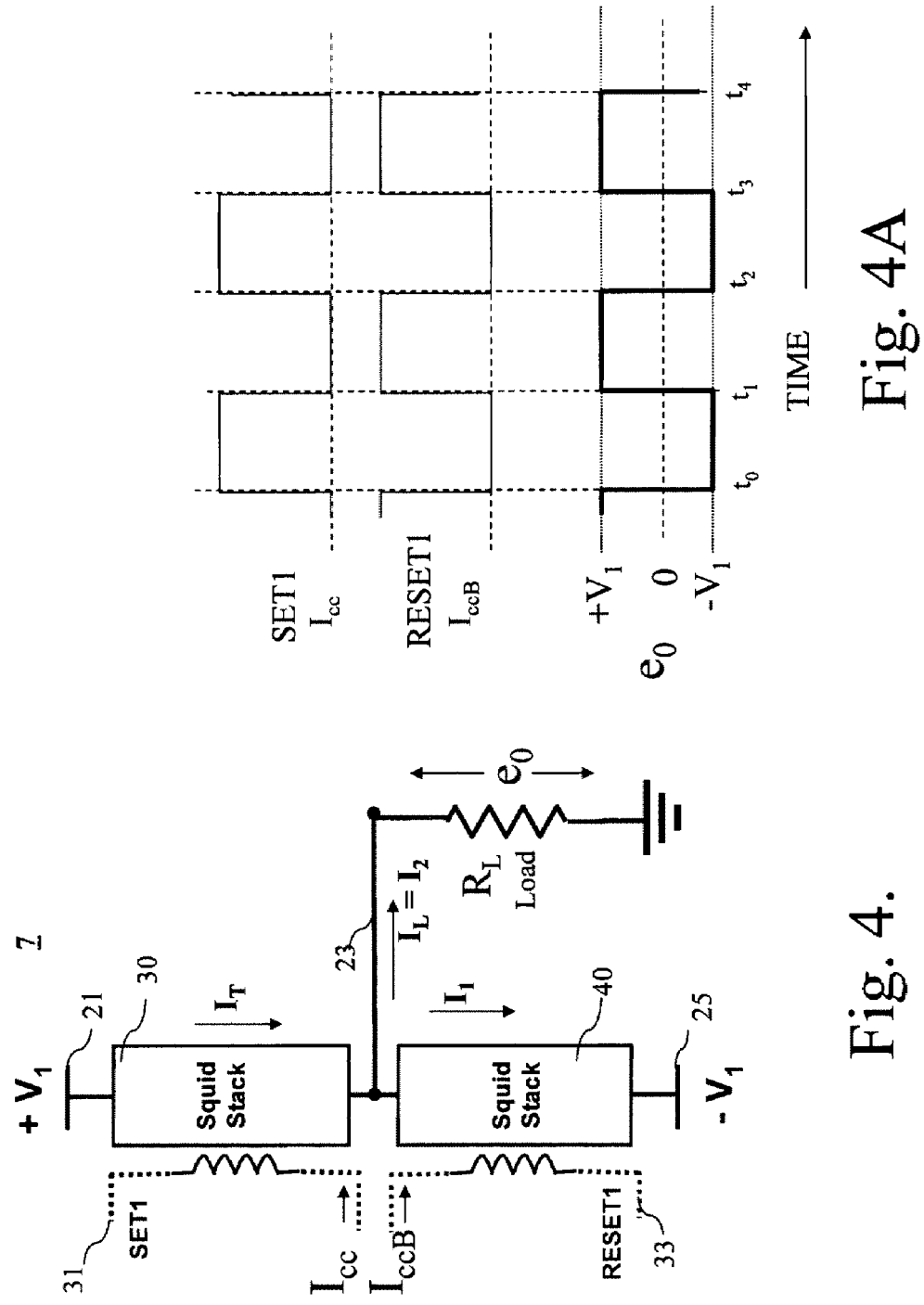
FIG. 4 is a highly simplified block diagram of a circuit embodying the invention.
FIG. 4A is a waveform diagram pertaining to the circuit of FIG. 4.

Referring to FIG. 4, there is shown an amplifier 7 comprised of a first SQUID stack 30 and a second SQUID stack 40. SQUID stack 30 is connected between a first voltage line 21 and on output terminal 23 and SQUID stack 40 is connected between output terminal 23 and a second voltage line 25. In FIG. 4, a voltage (+)V1 is applied to line 21 and a voltage of (−)V1 is applied to line 25. A control line 31 for controlling the critical current (Ic) level of SQUID stack 30 is formed to extend and wind about the SQUIDs of stack 30 and a control line 33 for controlling the critical current level of SQUID stack 40 is formed to extend and wind about the SQUIDs of stack 40. A load resistor RL is shown connected between output line 23 and a point of reference potential (i.e., ground, but another suitable voltage between +V1 and −V1 could be used instead).

Complementary input signals, denoted as Icc (also SET 1) and IccB (also RESET 1), are respectively applied to control lines 31 and 33. The control signal on line 31 is magnetically coupled to the SQUIDs of stack 30 and the control signal on line 33 is magnetically coupled to the SQUIDs of stack 40.

That is, in circuits embodying the invention there is DC isolation between the control signals and the currents flowing through the SQUIDs.

Figure 5:
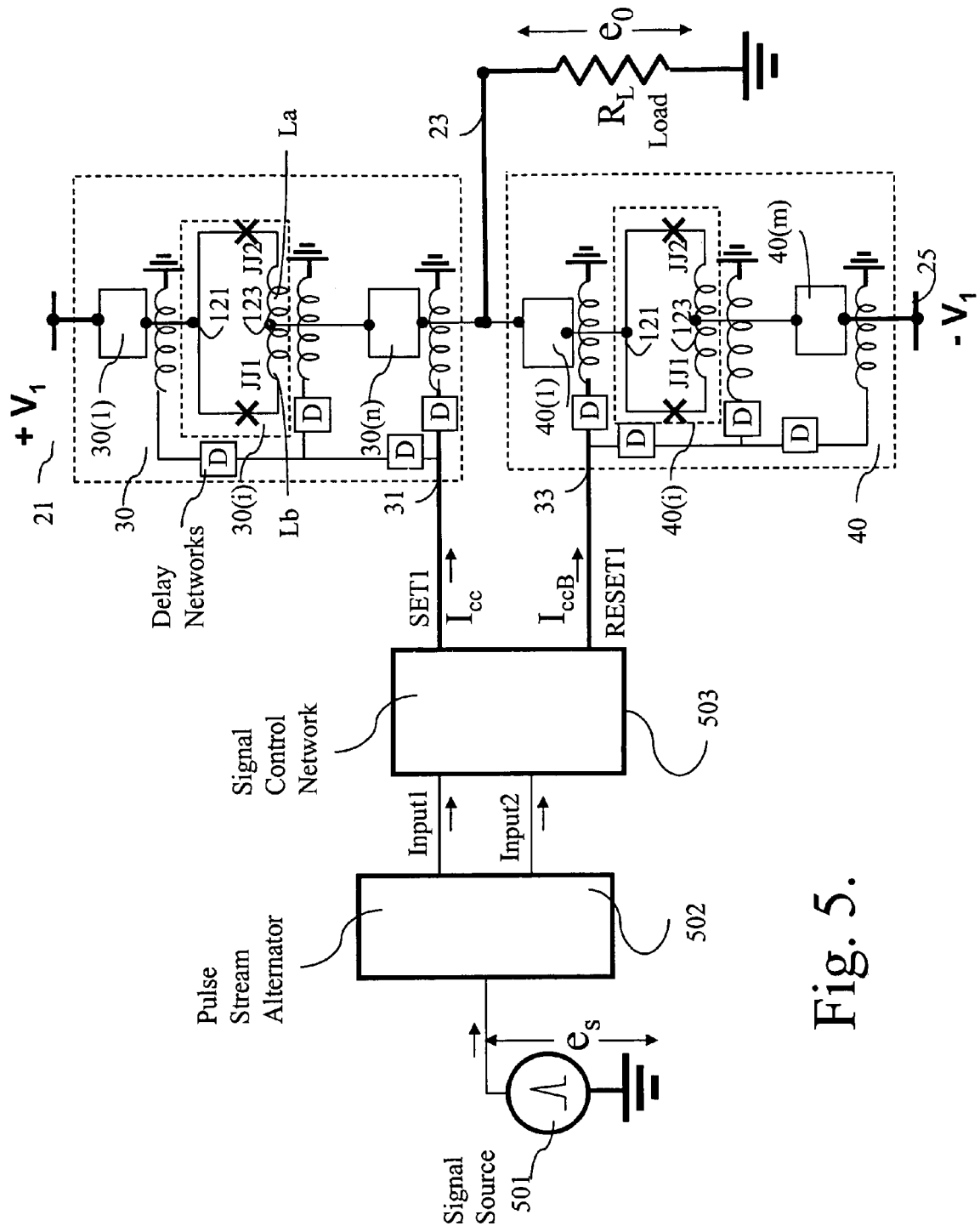
FIG. 5 is a more detailed schematic diagram of a circuit embodying the invention.

To better explain the operation of the circuit of FIG. 4, reference will be made to the more detailed circuit schematic shown in FIG. 5 and to the waveform diagram of FIG. 4A. Each SQUID stack includes a multiplicity of SQUIDs connected in series as shown in FIG. 5. Thus, stack 30 includes "n" SQUIDs connected in series and stack 40 includes "m" SQUIDs connected in series. The numbers n and m are integers equal to, or greater, than one; and n and m are generally made equal to each other for purpose of symmetry; but need not be made so. Each SQUID includes an input point 121, an output point 123 and two Josephson junctions (JJ1, JJ2) connected in parallel between the input and the output points by means of an inductance, La, Lb. The critical current (Ic) of each SQUID is controlled (set to a high value, Ich, or a low value, Icd) by magnetically coupling a control current signal into the SQUID loop via the inductance La, Lb.

In practice, there may be a large number (e.g., 50) of SQUIDs in each stack. The reason for stacking a large number of SQUIDs is that the resistance of a single SQUID when in the resistive state is in the range of one (1) ohm and the currents through the SQUID is generally in the order of 0.5 milliamperes. Thus, in order to produce signal voltages in the millivolt range it is necessary to have resistances in the range of 40 or 50 ohms. This can only be achieved by connecting a large number of SQUIDs in series (e.g., 40 or 50 or more). Note that if a SQUID were made to have a much higher resistance in its resistive state, than those presently available, the invention could be practiced with just one or two series connected SQUIDs. This would avoid the problem associated with having to stack a large number of SQUIDs in series and of finding ways to operate them so they respond at the same time when switching from one state to the other.

As already noted, the need to have a large number of SQUIDs connected in series presents several problems. One problem is that the characteristics of the SQUIDs in a stack should be very similar, if not identical. This requires that the reproducibility of the devices be well controlled. The difficulty in making a large number of identical devices puts a limit on the number of SQUIDs that can be reliably connected in series. Another problem is that of controlling the responses of the SQUIDs in a stack so that they all are driven to the superconductive state or to the resistive state at the same time. When a large number of SQUIDs are connected in series this becomes very problematic since the control signals for setting or resetting the SQUIDs must be distributed over relatively large distances at the frequencies of interest. At the operating frequencies of interest, very small differences in the length of a wire can cause a significant difference in the time when one device responds as compared to another (i.e., propagation delay of the control signals). Differences in the response time of the devices of a stack reduces the effective bandwidth of the circuit very significantly. Various solutions to the problem of setting a large number of SQUIDs to one condition or another condition at the same time are discussed below.

Figure 1:
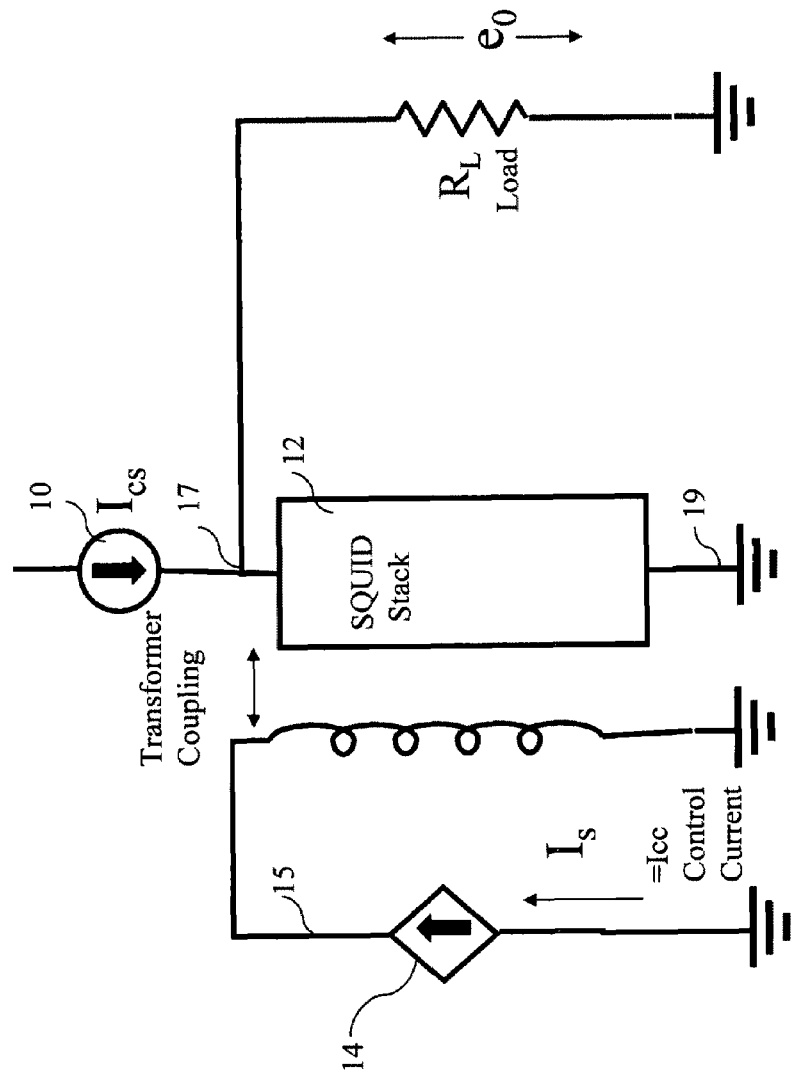
FIG. 1 is a highly simplified schematic diagram of a prior art circuit
Figure 2:
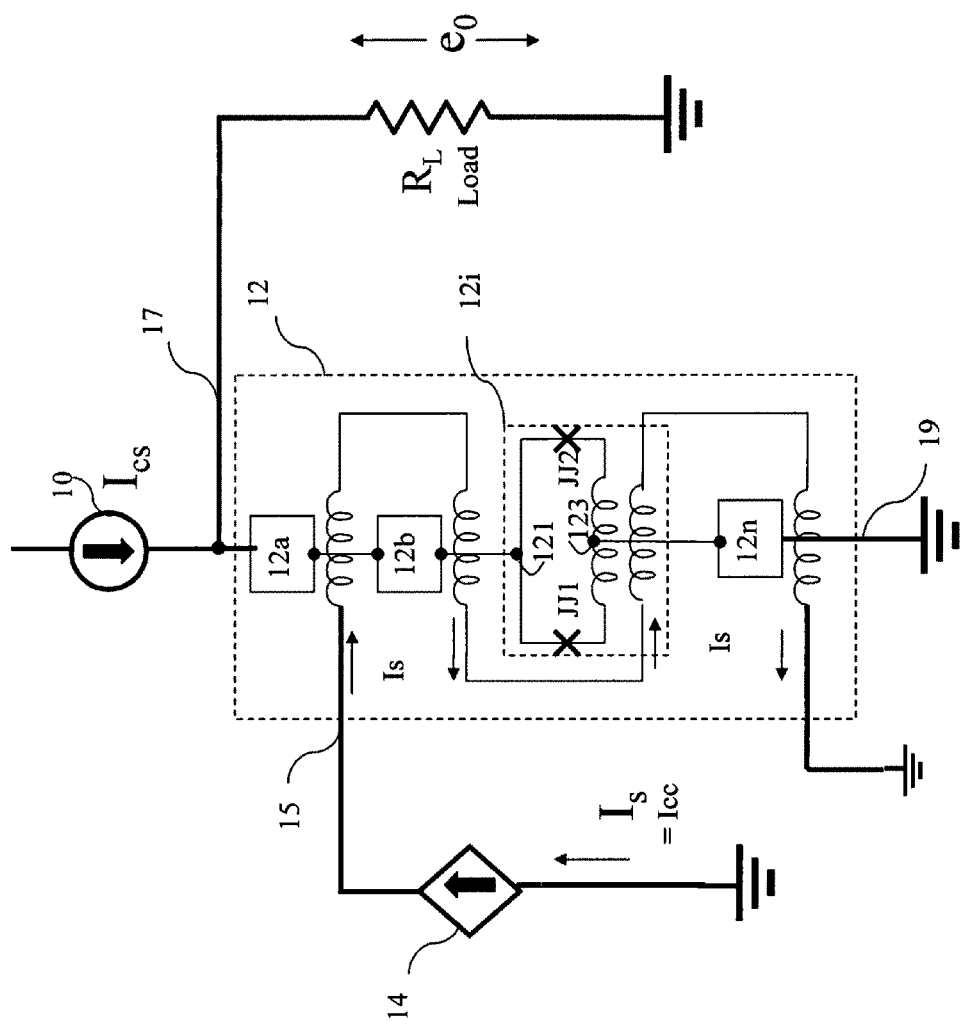
FIG. 2 is a more detailed schematic diagram of the prior art circuit of FIG. 1 illustrating that a stack includes numerous SQUIDs and a control line extends to all the SQUIDs of the stack.
Figure 3:
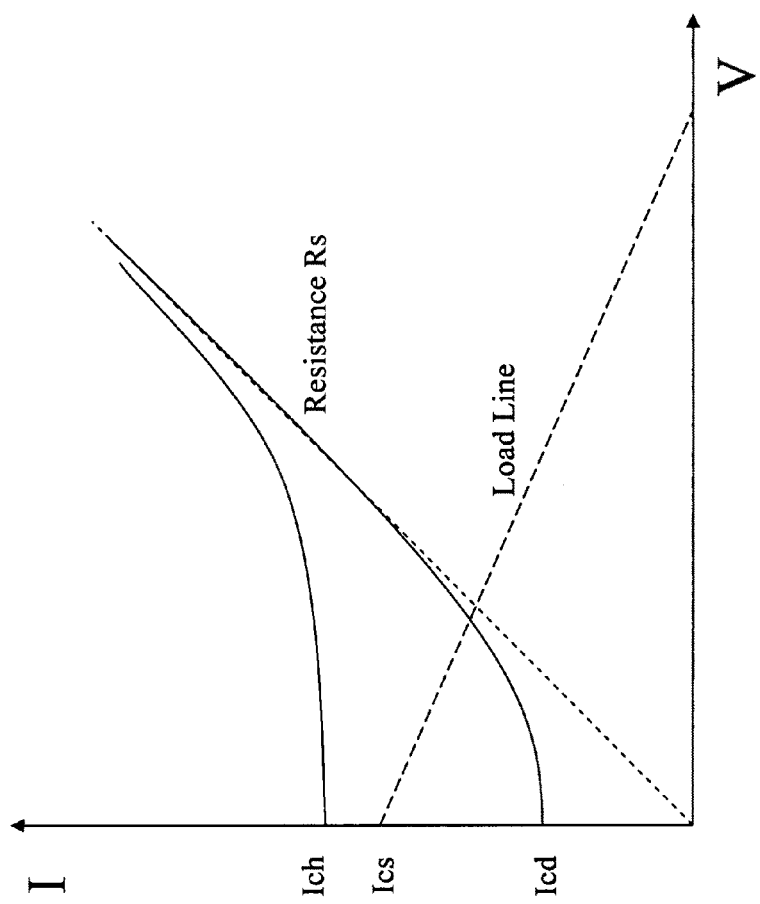
FIG. 3 is a current voltage (I-V) diagram illustrating the typical response of a SQUID

Assume, for purpose of illustration, that in FIGS. 4 and/or 5 there are 50 SQUIDs in each one of stack 30 and 40 and that in the superconducting state (SCS) each SQUID exhibits essentially zero resistance and in the resistive state (RS) each SQUID exhibits essentially a resistance of 1 ohm. (Bear in mind, as shown in FIG. 3, that the SQUID in its resistive state is not a simple linear resistor, so that this estimated 1 ohm resistance is an approximation. However, for purpose of illustration, this assumption is maintained.) Assume also, for example, that the control (input signal) circuitry is operated to produce an input control signal (Is or Icc) such that the critical current (Ic) of each SQUID may be set to either: (a) a high value of Ic (Ich) of, for example, 0.5 milliamperes (mA) to cause the SQUID to be in the superconducting state for a SQUID current (Ics) of less than 0.5 mA; or (b) a depressed current condition (Icd) of, for example, 0.25 mA to operate the SQUID in the resistive state for SQUID currents (Ics) in excess of 0.25 mA. For purpose of illustration, assume also that RL is made equal to 50 ohms.

As shown in FIG. 5, there is an input signal source 501 whose output is supplied to an input pulse processor 502. The signal source 501 may be a signal source of the type which produces a train of narrow voltage pulses such as single flux quantum (SFQ) in RSFQ superconducting logic. The signal source and input signal processor are shown by way of example, and it should be understood that many different types of input signal generators for generating complementary control signals may be used instead. The point of interest is that complementary control signals be generated which are suitable to drive and cotnrol the superconducting switching amplifier(s) of the invention.

In FIG. 5, a train of pulses (or more than one pulse train) is supplied to circuit 502 which, in response to the input pulse train, can produce an alternate stream of pulses at its two outputs (the pulses at these outputs may have half the rate of the signal source pulse train). The two outputs of circuit 502 at which alternating pulses are produced are denoted as Input 1 and Input 2. The signals denoted as Input 1 and Input 2. are supplied to a signal control network 503. The control network 503 (which may be of the type shown in FIG. 11) functions to produce complementary control signals denoted as Icc (SET1) and IccB (RESET1) in response to signals from the signal source 501. The control network 503 thus functions to convert very narrow pulses into complementary signals shown, for example, as SET1 and RESET1 in FIGS. 4A and 6A. The circuit shown in FIGS. 4 and 5 functions such that, in response to pulsed "current" signals of relatively low voltage/current amplitude (which may be defined as the input signals) complementary signals are generated on control lines 31 and 33 of sufficient amplitude to cause the output voltage produced at output terminal 23 to switch between the voltages applied to rail 21 (e.g., +V1 volts) and the voltage applied to rail 25 (e.g., (–)V1 volts). The complementary control signals distributed along and via lines 31 and 33 are used to set and control the critical currents (Ic) of the SQUIDs in stacks 30 and 40 such that the critical currents of the SQUIDs in the upper stack (e.g., 30) and lower stacks (e.g., 40) are always set to complementary conditions (i.e., resistive and superconductive). That is, the Ic of the SQUIDs in stack 30 is set to Ich and the Ic of stack 40 is set to Icd, for one signal condition and the Ic of stack 30 is set to Icd and the Ic of stack 40 is set to Ich for another signal condition.

By way of example, from time t1 to t2 in FIG. 4A, for one condition of input signal, stack 30 is placed in the superconductive state and stack 40 is placed in the resistive state. For this condition, the output terminal 23 is essentially clamped to terminal 21 (positive rail) via the zero impedance of stack 30. To achieve this condition the control line 31 current signal (Icc) is of a polarity and magnitude to cause the critical current (Ic) of the devices in the upper stack 30 to be set to an Ich value (e.g., of 0.5 mA). The devices of the upper stack will then remain in the superconducting state (SCS) so long as the current (Ics) though the SQUIDs of the top stack 30 is less than 0.5 mA. If the Ics current though the upper SQUIDs were to exceed the value of Ich, the SQUIDs in the stack would switch to the resistive state. So, the total current ($I_T$) through the stack in the super conducting state (e.g., the upper stack 30) must be maintained below the value of Ich to maintain the stack in the superconducting state. At the same time the value of current flowing through the stack in the resistive state (e.g., the lower stack 40) must be maintained above the depressed value Icd of the SQUIDs in the stack to maintain these SQUIDs in their resistive state.

An analysis of the circuit indicates that the total current ($I_T$) through the upper stack (in the superconducting state) is equal to the sum of the current ($I_1$) through the lower resistive stack and the current ($I_2$) through the load resistor. The current $I_T$ must be less than the Ich of 0.5 mA. At the same time, the current $I_1$ must be maintained greater than Icd. For the conditions shown in FIGS. 4, 4A and 5, the value of $I_1$ is equal to 2V divided by the total series resistance (Rs) of the lower stack operated in the resistive state; where 2V is equal to (+)V1-(−)V1. This current (I1) must be greater than the depressed critical current (Icd) to maintain the lower SQUID stack in its resistive state.

Applicants' invention resides, in part, in the recognition that the range of applied voltages and the currents in the SQUIDs must be carefully controlled to achieve the desired push-pull effect (complementary switching of control signals to two SQUID stacks) to selectively clamp the output terminal to the voltage on line 21 or to the voltage on line 25.

For a given RL and for a given Rs (where Rs is the total resistance of a stack in the resistive state) and for given values of Ich and Icd, a range of permissible operating voltages may be determined and applied to terminals 21 and 25. Where V1 is equal to (+)V and V2 is equal to (−)V, a lower value for V may be calculated as that value of V for which 2V/Rs is greater than Icd. The maximum value of V is that value of V for which [2(V/Rs)+(V/RL)] is lower than Ich. Where, as defined above, Icd is the depressed value of Ic of the SQUID, which must be exceeded by the current (Ics) flowing through the SQUID to maintain the SQUID in the resistive state, and Ich is the value of SQUID current which can not be exceeded if the SQUID is to be maintained (remain) in the superconducting state; and where 2V is the voltage between the two voltage rails (21 and 25). [Note that at low V the SQUID may act as a constant current source to maintain I1 greater than Icd. This limits the determination of the minimum values of V.]

Therefore, when the complementary control currents in control line 31 and 33 set the SQUIDS in the upper stack 30 to their superconducting state and the SQUIDS in the lower stack 40 to their resistive state, output terminal 23 of the circuit is clamped to the voltage (+V) on the upper rail 21, as shown in FIG. 4A at time t1 to t2. In a complementary fashion when the complementary control currents in control line 31 and 33 set the SQUIDS in the upper stack 30 to their resistive state and the SQUIDS in the lower stack 40 to their superconducting state, the output on line 23 of the circuit is clamped to the voltage (−V) on the lower rail 25, as shown in FIG. 4A for time t0 to t1 or t2 to t3. The circuit of FIGS. 4 and 5 may thus function as a switching or digital amplifier producing an output which swings between +V volts and −V volts. As shown in FIG. 4A, in circuits embodying the invention the output voltage $e_0$ swings between +V1 and −V1, which may equal 2V volts.

Depending on the values of Ich and Icd and on the values of Rs and RL, voltages in excess of 10 millivolts may be obtained with circuits embodying the invention.

FIG. 5 shows the distribution of the control signals along control lines 31 and 33. In this figure the control signals applied to each stack are applied in a generally parallel arrangement, with delay networks (D) distributed along the control lines to ensure that all the SQUIDs of a stack are set in one state, or another, at the same time. It should also be noted that the set and reset signals produced by network 503 (see also FIG. 11) are well controlled to ensure that the control signals are in synch and complementary to each other. Thus, in circuits embodying the invention all the SQUIDS of a stack are driven to the same state (e.g., superconductive or resistive) at substantially the same time and the two stacks forming a switching amplifier are also driven to complementary states at approximately the same time.

Figure 6:
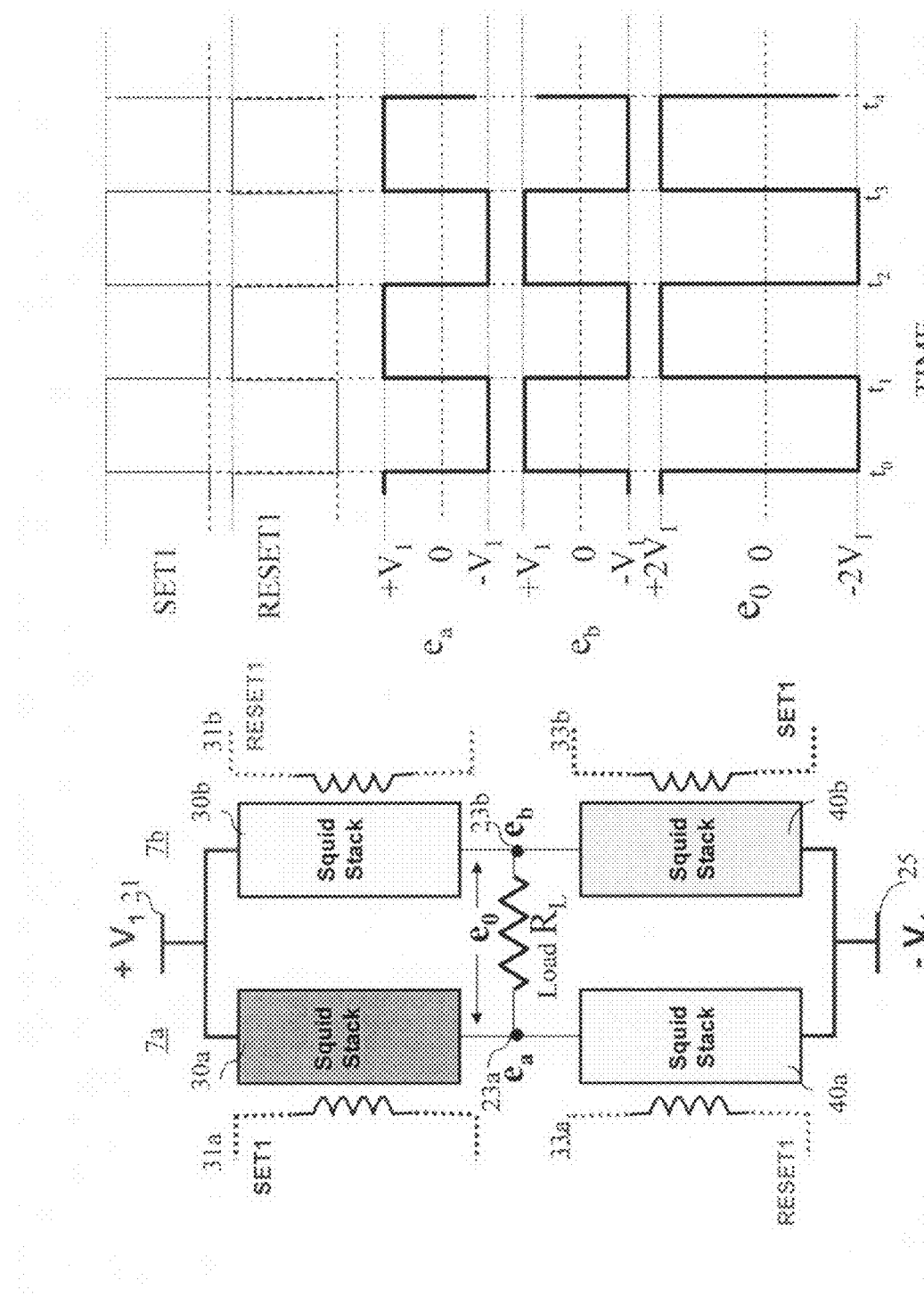
FIG. 6 is a block diagram of a differential switching amplifier embodying the invention.

Two amplifiers of the type shown in FIGS. 4 and/or 5 may be interconnected to form a differential amplifier as shown in FIG. 6. In this configuration, the circuit includes two switching amplifiers 7a, 7b, each amplifier having 2 SQUID stacks, the two SQUID stacks of each amplifier being operated in a complementary manner as described above for FIGS. 4 and 5. A load resistor RL is connected between the outputs (23a, 23b) of the two amplifiers so as to be differentially driven. In this configuration, the control current line 31a sets the devices of upper stack 30a to the superconducting state and, concurrently, the control current line 33b (which may be a continuation of 31a) sets the devices in lower stack 40b to the superconducting state. At the same time, the control current line 33a sets the devices of lower stack 40a to the resistive state and, concurrently, the control current line 31b (which may be a continuation of 33a) sets the devices in upper stack 30b to the resistive state. When, subsequently, signal pulses are applied to lines 31a and 33b to cause their corresponding devices to be placed in their resistive state, pulses are concurrently applied to lines 33a and 31b to cause their corresponding devices to be placed in their superconducting states. As shown in FIG. 6A, for the example given at time t0, the voltage ($e_a$) at output 23a can swing between +V1 and −V1 while at the same time the voltage ($e_b$) at output 23b can swing between −V1 and +V1. Thus, the change in the voltage across the load resistor can go from +2V1 to −2V1. Note that this is consistent with the fact that when the voltage at $e_a$ is +V1, the voltage at $e_b$ is −V1 (and vice-versa). Thus the voltage across load is 2V. The amplitude of the current through the load equals to 2V/RL with the direction of the current through the load being of function of the conductivity of the stacks. The current through the superconducting branches may be greater than for the case of the single ended amplifier. An advantage of the FIG. 6 circuit is that the voltage amplification is twice that of the circuit of FIGS. 4 and 5 and the differential output lends itself to be applied to the inputs of a conventional semiconductor differential amplifier. Also, the load resistor in the differential amplifier of FIG. 6 may be made to have twice the value of RL of the single ended amplifier of FIG. 4. Then the current through the superconducting branches will be the same for both the differential and single-ended cases, although the power through the load will be doubled.

Figure 7:
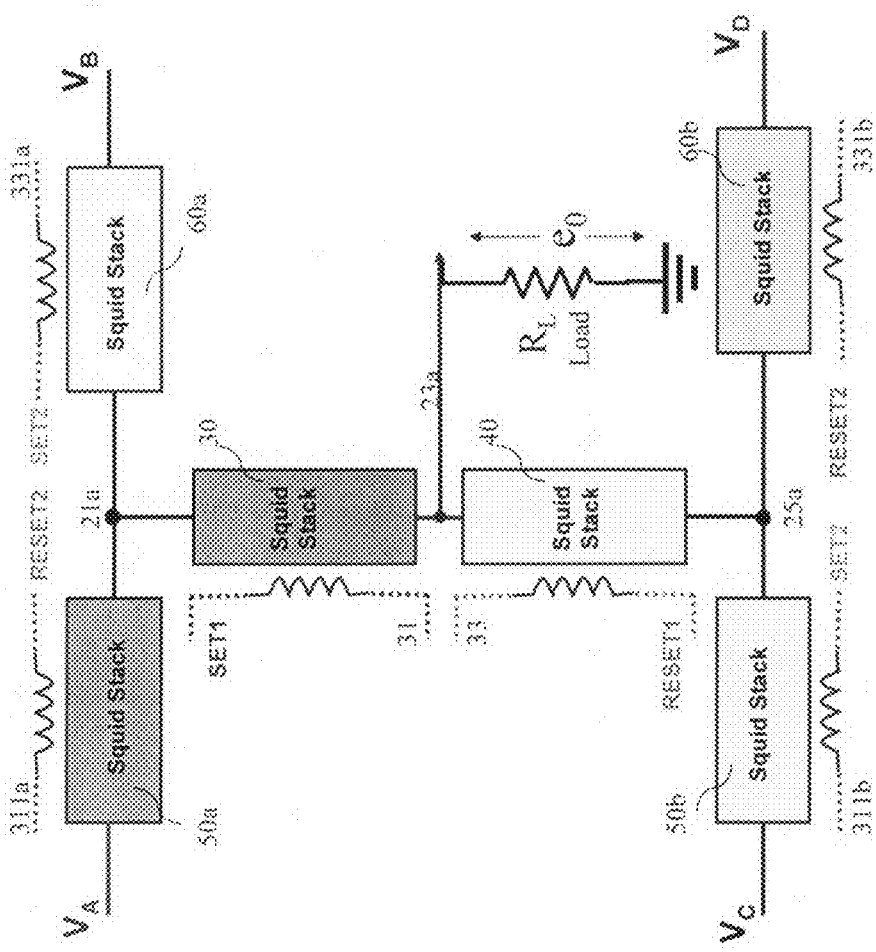
FIG. 7 is a block diagram of an amplifier embodying the invention with circuitry for switching the supply voltages applied to the amplifier.

Description and Discussion of FIGS. 7 and 8

FIG. 7 illustrates that the voltages applied to the voltage lines 21a and 25a can be varied by using additional switching complementary stacks (50a/60a and 50b/60b). The basic amplifier comprising stacks 30 and 40 which is shown to be connected between power terminals denoted as 21a and 25a functions generally as described for the circuit of FIGS. 4 and 5. In addition, a stack of SQUIDs 50a is connected between a source of potential VA and voltage line 21a and a stack of SQUIDs 60a is connected between voltage line 21a and a source of potential VB. The conductivity of the SQUIDs in stacks 50a and 60a is controlled by means of signals applied to control lines 311a and 331a which extend around and/or along the SQUIDs of their respective stacks. The signals applied to the control lines may be used to apply either VA volts or VB volts to voltage line 21a. In similar manner, a stack of SQUIDs 50b is connected between a source of potential VC and voltage line 25a and a stack of SQUIDs 60b is connected between voltage line 25a and a source of potential VD. The conductivity of the SQUIDs of the stacks in stacks 50b and 60b is controlled by means of signals applied to control lines 311b and 331b which extend around and/or along the SQUIDs of their respective stacks. The signals applied to these control lines may be used to apply either VC volts or VD volts to voltage line 25a.

The operation of the amplifier with VA or VB applied to line 21a and VC or VD applied to line 25a is similar to the operation of the amplifier of FIGS. 4 and 5. But, it is significant that by selectively altering the potential applied to the voltage lines (21a, 25a) the output voltage at output terminal 23a may be tailored as shown in FIG. 7A. Tailoring the output of the amplifier enables the introduction of compensation and/or predistortion into the signal being propagated. In order to generate the shaped output in FIG. 7A, two distinct sets of (two) complementary control signals are needed. A complementary set of control signals SET1 and RESET1 control the critical currents in stack 30 and 40 and determine whether the output voltage is clamped to rail 21a or rail 25a (see FIG. 7). A further complementary set of control signals SET2 and RESET2, as shown in FIG. 7A, operating at, for example, twice the frequency of SET1 and RESET1, switch the voltage on rail 21a to VA or VB and the voltage on rail 25a to VC or VD. By way of example, voltage VA may be applied to line 21a and either voltage VC or VD may be applied to line 25a; or voltage VB may be applied to line 21a and either voltage VC or VD may be applied to line 25a. Then, depending on the condition to which the amplifier is set, the output voltage may be made to swing between a high value of VA or VB and a low value of VC or VD. It should be evident that the additional line voltage switching SQUID stacks (50a/60a and 50b/60b) may be optimized differently than the primary basic amplifier stacks (30, 40).

FIG. 7 illustrates the use of switching amplifiers for switching the operating voltages applied to a single amplifier. It should be appreciated that the line voltage switching circuitry of FIG. 7 may be used to switch the operating voltages of a differential amplifier as shown in FIG. 8. In FIG. 8, as in FIG. 7, the control signals to the voltage switching stacks 50a/60a determine whether VA or VB is applied to voltage terminal 21a and the control signals to the voltage switching stacks 50b/60b determine whether VC or VD is applied to voltage terminal 25a. In FIG. 8 the amplifiers 30a/40a and 30b/40b, forming a differential amplifier, are connected to the same voltage lines (i.e., 21a, 25a). It should be appreciated that one amplifier (e.g., 30a, 40a) could be connected between voltage lines 21a and 25a and the other amplifier (e.g., 30b, 40b) could be connected between two different voltage lines (not shown) whose voltages could be set by use of additional voltage switching stacks similar to, but other than, 50a/60a and 50b/60b. A load resistor would still be connected between the outputs of the two amplifiers to define a differential configuration.

In FIG. 8, when an additional voltage switching SQUID stack (e.g. 50a and 60b) is in the superconductive state, it must carry the load current flowing through the differential amplifier (e.g., stack 30a in series with RL in series with stack 40b; or stack 30b in series with RL in series with stack 40a) and the resistive current flowing through its complementary voltage switching stack (e.g., 60a, 50b). As already noted, the switching of the voltages applied to the differential amplifier may be used to modify and/or shape the amplifier output signal for a number of reasons including compensation and/or predistortion.

Figure 9:
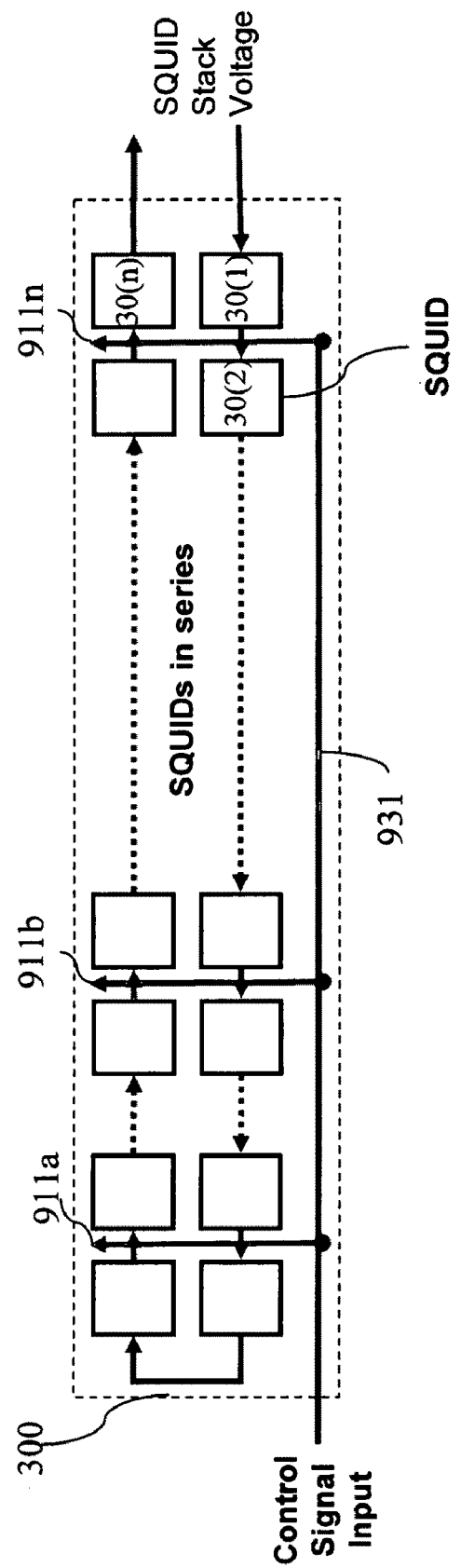
FIG. 9 is a diagram illustrating the layout of a stack of SQUIDs connected in series in a linear stack.
Figure 10:
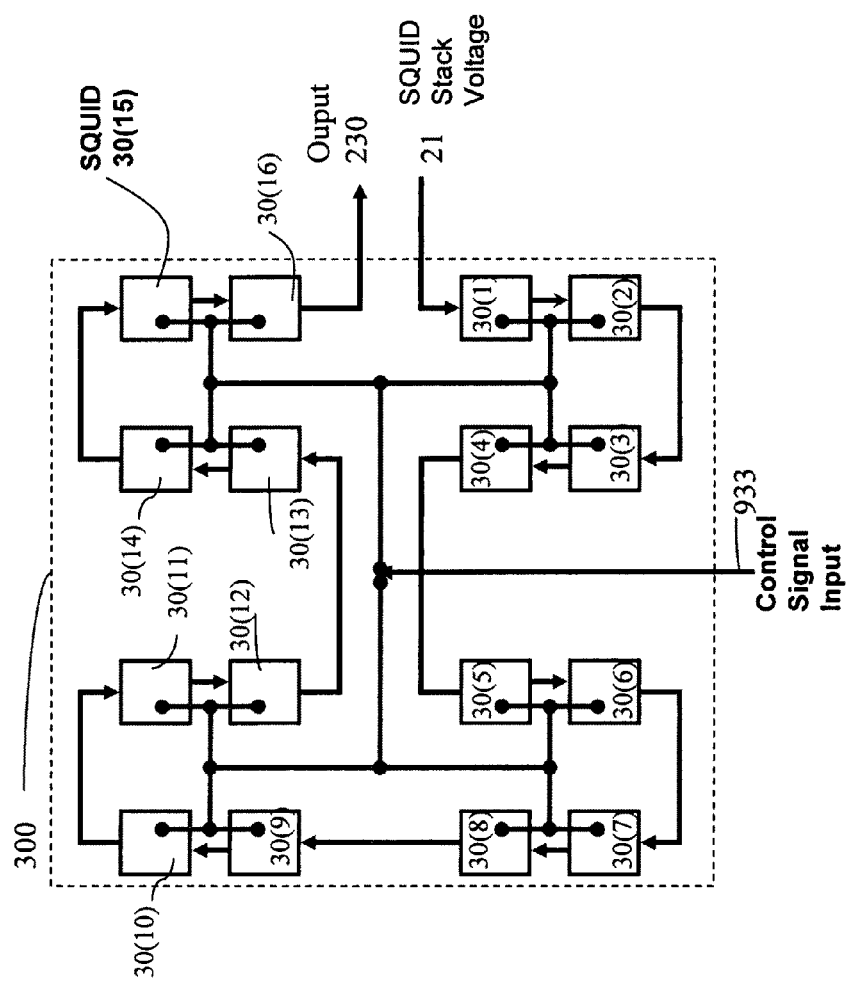
FIG. 10 is a diagram illustrating the layout of a stack of SQUIDs connected in an H-Tree configuration.

Description and Discussion of FIGS. 9 and 10

FIG. 9 is a block diagram of a stack of SQUIDs, where the SQUIDs are connected in series in a U-shaped lay-out with a control line 931 running along the legs of the U and with multiple branches 911a extending from the control line 931 to service 4 SQUIDs. The SQUIDs in this configuration tend to switch in succession producing a waveform with long rise times which limit the data rate.

FIG. 10 is a block diagram of a stack 300 of 16 SQUIDs laid out in an H-Tree configuration. As may be seen from the drawing the SQUIDs are laid out in clusters of 4 and the control line 933 is routed about the SQUIDs such that a control signal applied to control line 933 is applied at the same time to all the 16 SQUIDs shown in the drawing. There may be a delay (latency) between the time the control signal is initially applied to control line 933 and the application of the control signal to the SQUIDs. However, it should be evident that this configuration permits all the SQUIDS in the same stack to switch at the same time enabling high speed response. By way of example, in FIG. 10, the voltage on line 21 is tightly coupled to output 230 when the 16 SQUIDs are operative in the superconductive state. Parallel stacks similar to stack 300 of FIG. 10 can be formed to produce multiples clusters of SQUIDs all connected in series with respect to their current carrying conduction paths.

Figure 12:
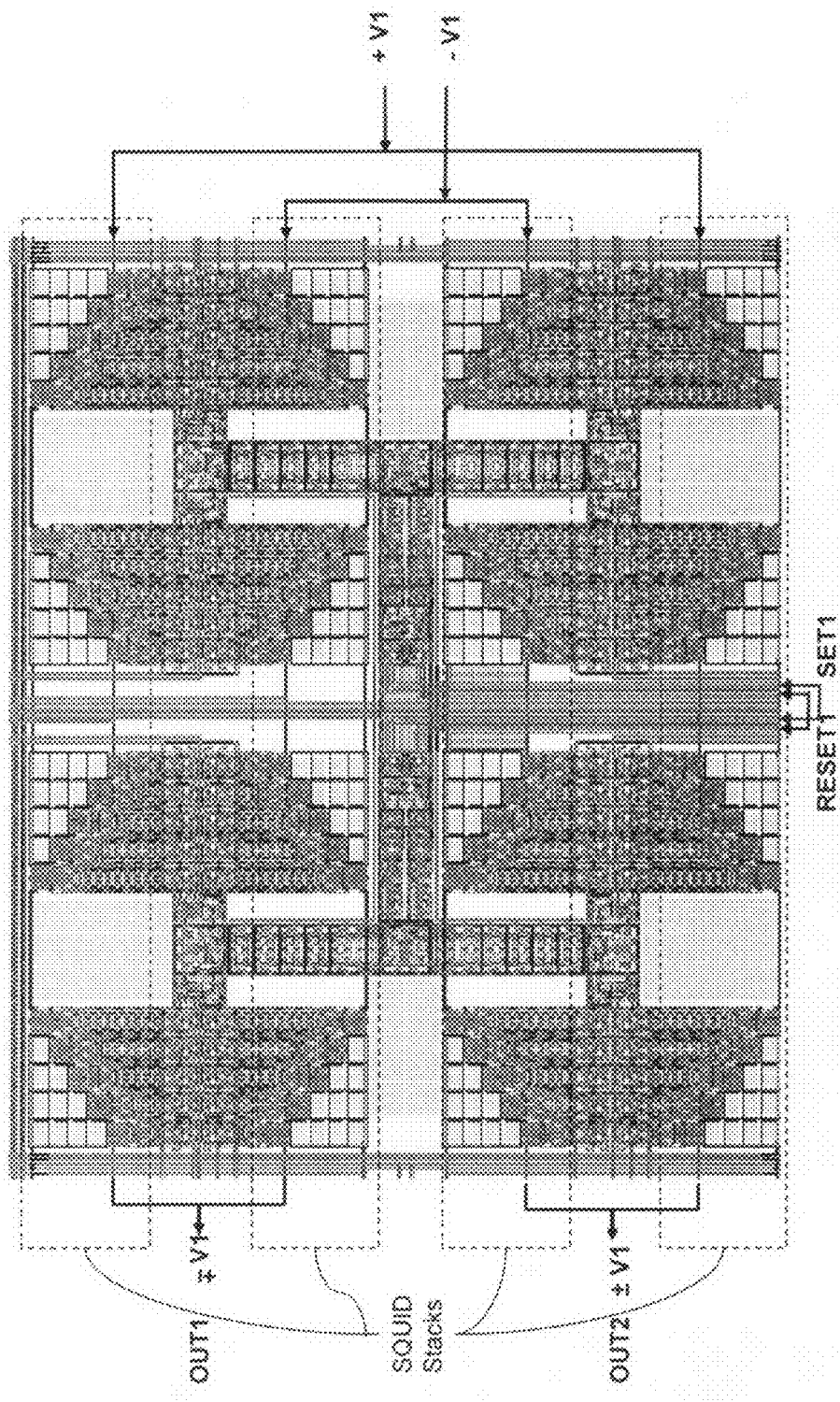
FIG. 12 is a diagram of the layout of an H-Tree differential amplifier

The problem of ensuring that all the devices (e.g., SQUIDs) of a stack are made to operate (turned on/off) at the same time is of even greater importance for the devices of the present invention, since it is critical not only to match time delays within each stack, but also to synchronize signals between different stacks. Also, it is useful to separate out the effects of an overall time delay from those of a dispersed (distribution or propagation) time delay. A dispersed time delay (among different control lines) will reduce the maximum switching frequency of the stack(s), thereby limiting output bandwidth. In contrast, an overall time delay will create a latency between input and output, but will not in itself limit the output bandwidth. Several circuit layout techniques have been developed for matching time delays in the control lines of the present invention; where the control lines are used to set the SQUIDS to different conditions. The principle of the H-tree SQUID stack is illustrated in FIG. 10, where 16 SQUIDs are connected in series, but are laid out in a square array, and are controlled by an H-tree set of control lines, which split in two after each delay element. Note that the distances to each SQUID element along the control lines may be made to be nearly identical. In FIG. 12, the H-tree distribution is combined with a triangle network, corresponding to the matching horizontal and vertical legs of an isosceles right triangle. If the control line skew is carefully managed, then the ultimate output bandwidth of the Switching Amplifier might approach the switching frequency of the individual SQUIDs, which can be of order 10 GHz or more. In contrast, the output bandwidth of SQUID stack amplifiers of the prior art (where control synchronization is not fully optimized) is typically of order 1 GHz or less.

Figure 11:
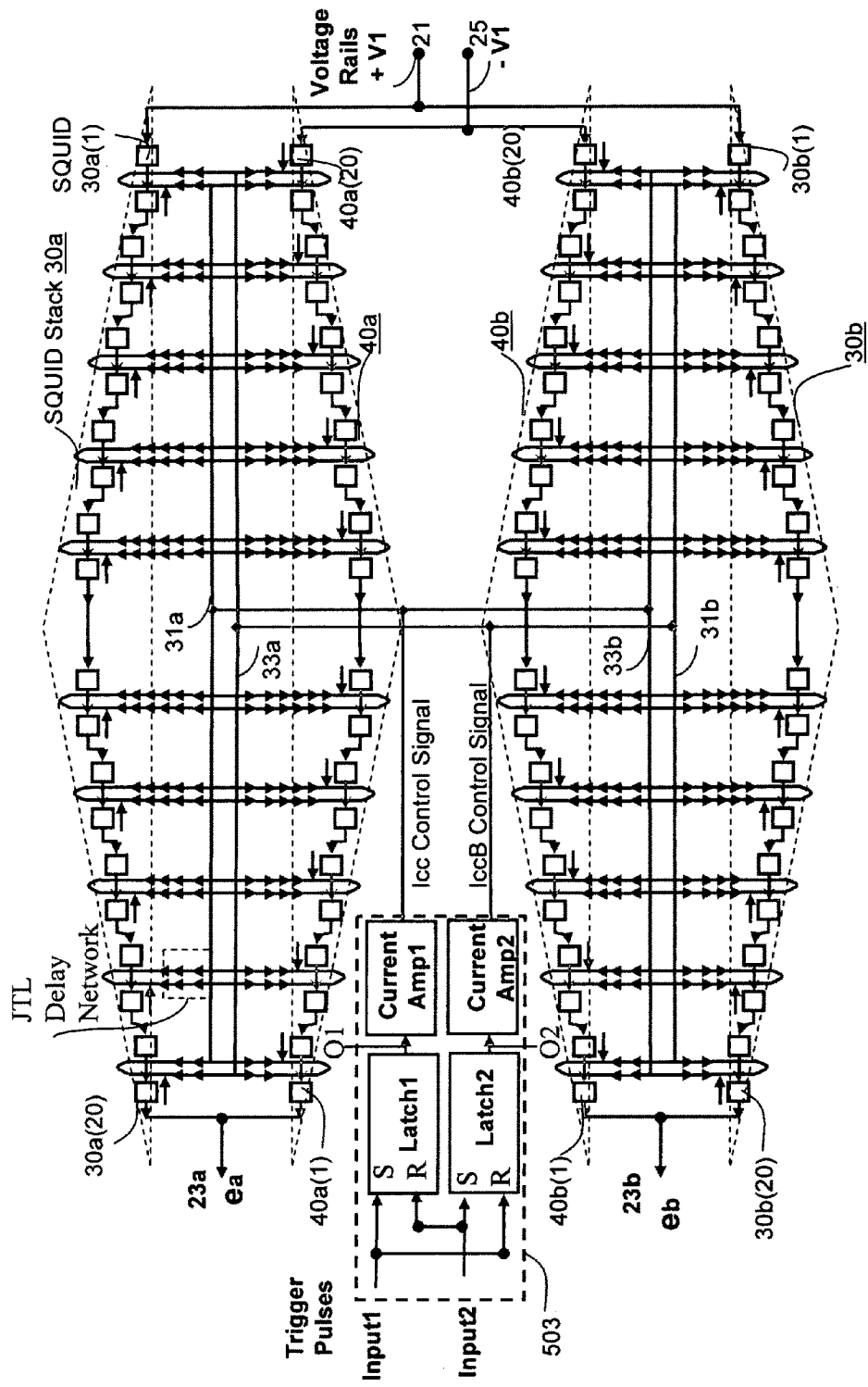
FIG. 11 is a diagram of the layout of a differential amplifier embodying the invention.

Description and Discussion of FIGS. 11 and 12

FIG. 11 is a depiction of a layout of a differential amplifier of the type described in FIG. 6. The SQUIDs in stacks 30a and 30b are shown to be connected in series between the positive voltage rail 21 to which is applied +V1 and their respective outputs 23a and 23b. Likewise the SQUIDs in stacks 40a and 40b are shown to be connected in series between the negative voltage rail 25 to which is applied −V1 and their respective outputs 23a and 23b. The SQUIDs in the various stacks are controlled by complementary signals generated by control network 503.

FIG. 11 shows: (a) input 1 to be applied to the S (set) input of latch 1 and to the R (reset) input of latch 2; and (b) input 2 to be applied to the S (set) input of latch 2 and to the R (reset) input of latch 1. The input 1 and input 2 signals may be very narrow pulses (e.g., 1-2 picoseconds wide). The output O1 from latch 1 and the output O2 from latch 2 are rectangular pulses which will always be complementary to each other, the pulse width and repetition rate being determined by the occurrence of the input 1 and input 2 signals. The latch outputs O1 and O2 are applied to corresponding current amplifiers 1 and 2 which function to buffer the rectangular latch output pulses and amplify the current to produce the complementary control signals (Icc and IccB) used to drive the control lines of the SQUID arrays.

The Icc control signals are propagated along lines 31a and 33b and the IccB control signals are propagated along lines 33a and 31b. In FIG. 11 the control signals are essentially distributed in parallel and differentially between the control lines along the SQUIDs of the stacks. Delay elements which may be Josephson transmission lines (JTL) in superconducting technology are located along the various control signal distribution paths controlling the SQUIDs to equalize the propagation delays along the lines. As shown in FIG. 11, the number of delay elements connected between a control line and a SQUID is a function of the physical location of the SQUID (i.e., different distribution paths may have a different number of delay elements). The JTL elements control the propagation of the control signal and provide additional drive current capability. The term 'length of line' for the control line may be understood in this context to represent an effective electrical length of a signal transmission structure associated with a given time delay. The delay for each stage of JTL may typically be of order several picoseconds. Note that the configuration of each stack (30a, 30b, 40a, 40b) including its associated delay elements gives the general appearance of a triangle. The clusters of stacks and the interconnecting control lines give the appearance of an H tree layout as already seen in FIG. 10.

FIG. 12 shows the layout of a differential amplifier depicting a triangular H-Tree configuration. As shown in FIGS. 10 and 11 the SQUIDs in a given stack are always electrically connected in series, although they need not be laid out in a straight line. The control lines for the SQUIDs can be in series, or they can be in parallel, or some combination thereof. If the control line is split in two to generate two parallel control line segments, an appropriate splitter driver is necessary, otherwise the output currents will decrease. For our circuits, a JTL splitter (a standard RSFQ circuit) is used for this. The ultimate control line distribution is fully parallel, with the H-Tree or triangle layout to assure identical delays to all SQUIDs.

It should be appreciated that FIGS. 11 and 12 are intended to illustrate that the SQUIDs may be formed in clusters with the control signals distributed such that all the SQUIDs of a stack are driven to the same state at substantially the same time. Furthermore, in circuits embodying the invention where two stacks (e.g., 30a, 40a) are operated in a complementary fashion, the SQUIDs of the two stacks are designed to be operated in complementary fashion and the complementary control signals are distributed such that the two stacks respond at substantially the same time. That is, when one stack is set to the superconductive state, the other stack is set to the resistive state as may be observed from the circuitry and layout of FIGS. 11 and 12.

In the discussion of the operation of the SQUIDs used to practice the invention, it was assumed that the control current (Icc or IccB) is driven to two different current levels. However, in practice, a SQUID may be operated such that with zero control current (Icc=0), the SQUID is in a condition where its Ic is at Ich and any increase in the Icc above zero causes the Ic of the SQUID to decrease. In one typical SQUID configuration, the critical current (Ic) exhibits its maximum Ich in the absence of a control current. Then, a selected control current (of either sign) can reduce the critical current to its minimum value Icd, which may typically be approximately one-half of Ich.

It should be noted that the operating or bias voltages (e.g., +V1 and −V1) applied to the operating lines (e.g., 21, 25) may have a wide range of values and may be of the same polarity or of opposite polarity as long as the appropriate potential differential is provided.

It should also be appreciated that although SQUIDs have been used to illustrate the invention, other devices having similar characteristics could be used instead.

What is claimed is:

1. A combination comprising:
   first and second terminals for the application thereto of first and second different voltages, respectively;
   an output terminal;
   first and second set of devices, each set of said devices having a superconducting state in which it exhibits essentially zero impedance and having a resistive state in which it exhibits measurable impedance;
   said first set of devices being serially connected between the first terminal and the output terminal;
   said second set of devices being serially connected between the output terminal and the second terminal; and
   control means coupled to said first and second sets of devices for selectively setting the first set of devices in the superconducting state and the second set of devices in the resistive state for clamping the voltage at said first terminal to said output terminal and for selectively setting the second set of devices in the superconducting state and the first set of devices in the resistive state for clamping the voltage at said second terminal to said output terminal.

2. A combination as claimed in claim 1, wherein the first set of devices is a first set of superconducting quantum interference devices (SQUIDs); and the second set of devices is a second set of SQUIDs and wherein each set of SQUIDs includes a plurality of SQUIDs connected in series.

3. A combination as claimed in claim 2, wherein said SQUIDs have a critical current (Ic) and wherein, for a given SQUID current (Ics), selected SQUIDs may be set to a resistive state by lowering their critical current and to a superconductive state by raising their critical current; and wherein said control means coupled to said first and second set of devices includes means for selectively varying the critical currents of the devices in said first and second sets in a complementary manner and also include means for varying all the devices of each set at substantially the same time.

4. A combination as claimed in claim 2 wherein the superconducting state and the resistive state are deemed to be complementary states; and wherein control signals to drive the SQUIDs of a set to one state, or another, are distributed to the SQUIDs of the set so they are all driven to the same state at substantially the same time.

5. A combination as claimed in claim 4 wherein the control means includes means for driving the first and second set of devices to complementary states at substantially the same time.

6. A combination as claimed in claim 2 wherein when the first set of SQUIDs is in its superconducting state, the voltage present at the output terminal is clamped to the voltage at the first terminal and a total current (IT) flows through the first set of SQUIDs which is less than the critical current to which the first set of SQUIDs is set and wherein a first part (I1) of the total current (IT) current flows through the second set of SQUIDs and a second part flows through the load resistor, and wherein the current I1 flowing through the second set of SQUIDs is of greater amplitude than the critical current to which the second set of SQUIDs is set.

7. A combination as claimed in claim 1, wherein a load is connected to the output terminal.

8. A combination as claimed in claim 1, wherein a load is connected between the output terminal and another potential intermediate said first and second voltages.

9. A combination as claimed in claim 1, further including means for selectively varying the voltage applied to at least one of said first and second terminals.

10. A combination as claimed in claim 1, further including means for selectively varying the voltage applied to said first terminal and for selectively varying the voltage applied to said second terminal.

11. A combination as claimed in claim 10, wherein said means for selectively varying the voltage applied to said first terminal includes a first additional set of devices connected between a first point of operating potential and said first terminal and a second additional set of devices connected between a second point of operating potential and said first terminal; and wherein said means for selectively varying the voltage applied to said second terminal includes a third additional set of devices connected between a third point of operating potential and said second terminal and a fourth additional set of devices connected between a fourth point of operating potential and said second terminal.

12. A combination as claimed in claim 10, wherein the means for varying the voltages applied to the first and second terminals includes means for varying the voltage at a first rate which is faster than a rate of the control signals driving the first and second sets of devices.

13. A combination as claimed in claim 1, wherein said control means is responsive to a first signal for setting said first set of devices in a superconductive state and said second set of devices in the resistive state and to a second signal for setting said first set of devices in the resistive state and said second set of devices in the superconductive state.

14. A combination as claimed in claim 1 wherein said output terminal is a first output terminal, and further including:
a second output terminal and third and fourth set of devices, each set of said devices having a superconducting state in which it exhibits essentially zero impedance and having a resistive state in which it exhibits measurable impedance;
said third set of devices being serially connected between the first terminal and the second output terminal;
said fourth set of devices being serially connected between the second output terminal and the second terminal;
load means coupled between said first and second output terminals; and
wherein said control means coupled to said first and second sets of devices also includes means coupled to said third and fourth sets of devices for: (a) selectively setting the first and fourth sets of devices in the superconducting state and the second and third sets of devices in the resistive state for clamping the voltage at said first output terminal to the voltage at said first terminal and the voltage at said second output terminal to the voltage at said second terminal; and (b) for selectively setting the first and fourth sets of devices in the resistive state and the second and third sets of devices in the superconductive state for clamping the voltage at said first output terminal to the voltage at said second terminal and the voltage at said second output terminal to the voltage at said first terminal.

15. A combination as claimed in claim 14, wherein each one of the first, second, third and fourth set of devices is a set of SQUIDs and wherein each set of SQUIDs includes a plurality SQUIDs connected in series.

16. A superconducting switching amplifier comprising:
first and second voltage terminals for the application thereto of first and second, different, voltages, respectively;
an output terminal;
a first set of devices serially connected between the first voltage terminal and the output terminal;
a second set of devices serially connected between the output terminal and the second voltage terminal;
wherein said first and second set of devices exhibit virtually zero resistance, also defined as the superconducting state, when the current though the devices of the set is below a critical current; and wherein said first and second set of devices exhibit finite resistance, also defined as the resistive state, when the current though the devices of the set is above a critical current; and wherein the critical current of the first and second set of said devices may be raised or lowered by coupling a control signal to the devices; and
control means coupled to said first and second sets of devices for selectively setting the first set of devices in the superconducting state and the second set of devices in the resistive state for clamping the output terminal to the voltage at said first voltage terminal and the second set of devices in the superconducting state and the first set of devices in the resistive state for clamping the output terminal to the voltage at said second voltage terminal.

17. A superconducting switching amplifier as claimed in claim 16, wherein said output terminal is a first output terminal and further including:
third and fourth voltage terminals for the application thereto of third and fourth, different voltages respectively;
a second output terminal;
a third set of devices serially connected between the third voltage terminal and the output terminal;
a second set of devices serially connected between the output terminal and the fourth voltage terminal;
wherein said third and fourth set of devices exhibit virtually zero resistance, also defined as the superconducting state, when the current though the devices of the set is below a critical current; and wherein said third and fourth set of devices exhibit finite resistance, also defined as the resistive state, when the current though the devices of the set is above a critical current; and wherein the critical current of the third and fourth set of said devices is selectively raised or lowered by supplying a control signal to the devices; and
wherein said control means coupled to said first and second sets of devices also includes means coupled to the third and fourth set of devices for: (a) selectively setting the first and fourth set of devices in the superconducting state and the second and third set of devices in the resistive state for clamping the first output terminal to the voltage at said first voltage terminal and the second output terminal to the voltage at said fourth voltage terminal; and (b) selectively setting the second and third set of devices in the superconducting state and the first and fourth set of devices in the resistive state for clamping the first output terminal to the voltage at said second voltage terminal and the second output terminal to the voltage at said third voltage terminal.

18. A combination comprising:
first and second terminals for the application thereto of first and second different voltages, respectively;
an output terminal;
first and second set of devices, each set of said devices having a superconducting state in which it exhibits essentially zero impedance and having a resistive state in which it exhibits measurable impedance;
said first set of devices being serially connected between the first terminal and the output terminal;
said second set of devices being serially connected between the output terminal and the second terminal; and
control means coupled to said first and second sets of devices for selectively setting all the devices in the first set of devices, at substantially the same time, to one of the superconducting state and resistive state and all the devices in the second set of devices, at substantially the same time, to the other one of the superconducting state and resistive state; said control means including a control line and delay networks for distributing control signals to all the devices so they all respond to the control signals in the intended manner, at substantially the same time.

19. A combination as claimed in claim 18 wherein the devices of each set are laid out in clusters, the shape of the clusters and control lines having the form of an H configuration.

20. A combination as claimed in claim 19 wherein the devices of each set and their respective delay networks are laid out in the shape of a triangle.

21. A combination as claimed in claim 18 wherein the devices of each set and their respective delay networks are laid out in the shape of a triangle and wherein the different sets are interconnected via control lines in the form of an H configuration.

22. A superconducting amplifier comprising:
first and second terminals for the application therebetween of first and second different voltages, respectively;
an output terminal;
a first and a second set of superconducting devices, each set of superconducting devices having a superconducting state in which it exhibits essentially zero impedance and having a resistive state in which it exhibits a finite impedance;
means connecting said first set of devices between the first terminal and the output terminal;
means connecting said second set of devices between the output terminal and the second terminal;
control means coupled to said first and second sets of superconducting devices for selectively setting one of the first and second sets of devices in the superconducting state and the other one of the first and second sets of devices in the resistive state; and
means for selectively varying the voltages applied to the first and second terminals for modifying the voltage at the output terminal.

23. A superconducting amplifier as claimed in claim 22, wherein the first set of devices is a first set of superconducting quantum interference devices (SQUIDs); and the second set of devices is a second set of SQUIDs and wherein each set of SQUIDs includes a plurality of SQUIDs connected in series.

24. A superconducting amplifier as claimed in claim 23, wherein said SQUIDs have a critical current (Ic) and wherein, for a given SQUID current (Ics), selected SQUIDs may be set to a resistive state by lowering their critical current and to a superconductive state by raising their critical current; and wherein said control means coupled to said first and second set of devices includes means for selectively varying the critical currents of the devices in said first and second sets in a complementary manner and also include means for varying all the devices of each set at substantially the same time.

25. A superconducting amplifier as claimed in claim 22, wherein said means for selectively varying the voltages applied between said first and second terminals includes: (a) a first additional set of superconducting devices connected between a first point of operating potential and said first terminal and a second additional set of superconducting devices connected between a second point of operating potential and said first terminal; and (b) a third additional set of superconducting devices connected between a third point of operating potential and said second terminal and a fourth additional set of superconducting devices connected between a fourth point of operating potential and said second terminal.

26. A combination as claimed in claim 25, wherein the means for varying the voltages applied between the first and second terminals includes means for varying the voltage at a first rate which is faster than the rate of the control signals driving the first and second sets of devices for modifying the amplitude of the voltage produced at said output terminal.

27. A superconducting differential amplifier comprising:
first and second terminals for the application thereto of first and second different voltages, respectively;
first and second output terminals;
a first, a second, a third and a fourth set of superconducting devices, each set of superconducting devices having a superconducting state in which it exhibits essentially zero impedance and having a resistive state in which it exhibits a finite impedance;
means connecting said first set of devices between the first terminal and the first output terminal;
means connecting said second set of devices between the first output terminal and the second terminal;
means connecting said third set of devices between the first terminal and the second output terminal;
means connecting said fourth set of devices between the second output terminal and the second terminal;
a load connected between said first and second output terminals; and
control means coupled to said first, second, third and fourth sets of superconducting devices for selectively setting the first and fourth sets of devices to one of the superconducting state and resistive state and the second and third set of devices to the other one of the superconducting state and resistive state.

28. A superconducting differential amplifier as claimed in claim 27 further including means for selectively varying the voltages applied to the first and second terminals for modifying the amplitude of the voltages produced at the output terminals.

* * * * *